(12) United States Patent
Jeong

(10) Patent No.: US 12,230,586 B2
(45) Date of Patent: Feb. 18, 2025

(54) PRINTED CIRCUIT BOARD AND ELECTRONIC COMPONENT PACKAGE INCLUDING THE SAME

(71) Applicant: SAMSUNG ELECTRO-MECHANICS CO., LTD., Suwon-si (KR)

(72) Inventor: Koo Woong Jeong, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 539 days.

(21) Appl. No.: 17/577,687

(22) Filed: Jan. 18, 2022

(65) Prior Publication Data

US 2023/0108464 A1 Apr. 6, 2023

(30) Foreign Application Priority Data

Oct. 6, 2021 (KR) .................... 10-2021-0132144

(51) Int. Cl.
*H01L 23/552* (2006.01)
*H01L 21/48* (2006.01)
*H01L 23/498* (2006.01)
*H01L 23/00* (2006.01)

(52) U.S. Cl.
CPC ........ *H01L 23/552* (2013.01); *H01L 21/4857* (2013.01); *H01L 23/49822* (2013.01); *H01L 23/49816* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ...... H05K 1/0218–0227; H05K 1/0243; H01L 23/552
See application file for complete search history.

(56) References Cited

U.S. PATENT DOCUMENTS

| | | | |
|---|---|---|---|
| 2016/0276288 A1 | 9/2016 | Lee et al. | |
| 2019/0043662 A1* | 2/2019 | Yamamoto | H01G 4/12 |
| 2020/0176391 A1 | 6/2020 | Lim et al. | |
| 2020/0303318 A1* | 9/2020 | Morris | H01L 21/76874 |
| 2021/0175152 A1* | 6/2021 | Zhang | H01L 21/56 |
| 2022/0068835 A1* | 3/2022 | Kim | H01L 23/552 |

FOREIGN PATENT DOCUMENTS

| | | |
|---|---|---|
| KR | 10-2016-0111262 A | 9/2016 |
| KR | 10-2020-0067658 A | 6/2020 |
| KR | 10-2021-0002036 A | 1/2021 |

\* cited by examiner

*Primary Examiner* — Evan G Clinton
(74) *Attorney, Agent, or Firm* — MORGAN, LEWIS & BOCKIUS LLP

(57) ABSTRACT

A printed circuit board includes an insulating body having one surface and the other surface opposing each other, first and second wiring layers disposed on the one surface and the other surface of the insulating body, respectively, a seed layer disposed on the one surface of the insulating body and covering at least a portion of the first wiring layer, and a shielding layer covering a side surface of the insulating body and connected to the first and second wiring layers.

24 Claims, 11 Drawing Sheets

PRINTED CIRCUIT BOARD AND ELECTRONIC COMPONENT PACKAGE INCLUDING THE SAME

CROSS-REFERENCE TO RELATED APPLICATION(S)

This application claims benefit under 35 USC 119(a) of Korean Patent Application No. 10-2021-0132144 filed on Oct. 6, 2021 in the Korean Intellectual Property Office, the entire disclosure of which is incorporated herein by reference for all purposes.

TECHNICAL FIELD

The present disclosure relates to a printed circuit board and an electronic component package including the same.

BACKGROUND

As the performance of various electronic devices has improved due to the development of information and communications technology, electromagnetic interference shielding technology is receiving more attention as products become smaller and lighter. Interest in shielding technologies to improve communications stability and efficiency in high frequency domains such as 5 Generation (5G), mm-Wave and the like is increasing.

Research into electromagnetic interference (EMI) is being actively conducted, and the most representative and easiest method is to apply a metal shield can. However, to apply such a shield can, additional space in the printed circuit board is required, and perfect shielding cannot be achieved from the side and lower surfaces of the printed circuit board. In addition, the conformal shielding method also requires an additional process after package mounting, which also has problems in perfect shielding and process.

SUMMARY

This summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a printed circuit board and electronic component package having an Embedded Trace Substrate (ETS) structure, advantageous in electromagnetic wave shielding.

Another aspect of the present disclosure is to provide a printed circuit board and an electronic component package having a shielding layer covering a side surface of the printed circuit board, advantageous for electromagnetic wave shielding.

According to an aspect of the present disclosure, a printed circuit board includes an insulating body having one surface and the other surface opposing each other; first and second wiring layers disposed on the one surface and the other surface of the insulating body, respectively; a seed layer disposed on the one surface of the insulating body and covering at least a portion of the first wiring layer; and a shielding layer covering a side surface of the insulating body and connected to the first and second wiring layers.

According to an aspect of the present disclosure, an electronic component package includes a printed circuit board including an insulating body having one surface and the other surface opposing each other, a first wiring layer disposed on the one surface of the insulating body, a seed layer disposed on the one surface of the insulating body and covering at least a portion of the first wiring layer, and a first shielding layer covering a side surface of the insulating body; an electronic component disposed on the one surface of the insulating body; and a second shielding layer disposed on the one surface of the insulating body, connected to the first shielding layer, and enclosing the electronic component.

According to an aspect of the present disclosure, a printed circuit board includes an insulating body; a conductive layer disposed on one surface of the insulating body and including a pattern extending from an edge of the insulating body; a via disposed in the insulating body and connected to the pattern; and a shielding layer covering a first side surface of the insulating body and connected to the pattern. The pattern includes a first portion having a first thickness, a second portion having a second thickness, and a third portion having a third thickness sequentially disposed from the edge of the insulating body towards the via. Each of the first thickness and the third thickness is less than the second thickness.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
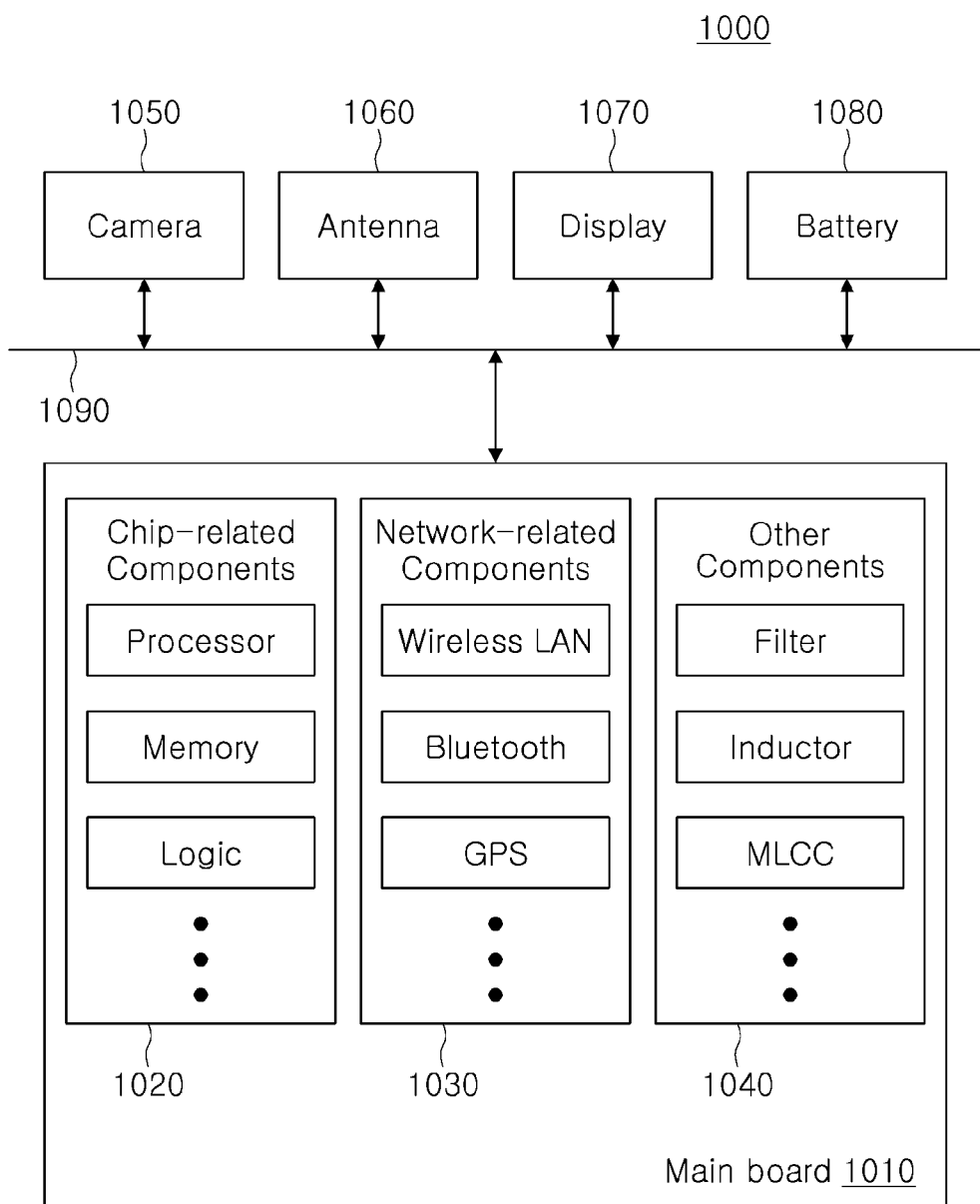
FIG. 1 is a block diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to, " or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" maybe used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components in addition to these chips. In addition, the chip related components 1020 may be combined with each other. The chip related components 1020 may have a package form including the chips described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with the chip related components 1020 and provided in the form of a package.

Other components 1040 may include a high frequency inductor, a ferrite inductor, a power inductor, ferrite beads, low temperature co-fired ceramics (LTCC), an electromagnetic interference (EMI) filter, a multilayer ceramic capacitor (MLCC), or the like. However, other components 1040 are not limited thereto, but may also include passive elements in the form of chip components used for various other usages, or the like. In addition, other components 1040 may be combined with the chip related components 1020 and/or the network related components 1030 and provided in the form of a package.

Depending on a type of the electronic device 1000, the electronic device 1000 may include other electronic components that may or may not be physically and/or electrically connected to the mainboard 1010. Examples of other electronic components include a camera module 1050, an antenna module 1060, a display 1070, a battery 1080, and the like. However, these other components are not limited thereto, and may include an audio codec, a video codec, a power amplifier, a compass, an accelerometer, a gyroscope, a speaker, a mass storage device (e.g., a hard disk drive), a compact disk (CD), a digital versatile disk (DVD), and the like. In addition thereto, the electronic device 1000 may also include other electronic components used for various purposes depending on the type of the electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
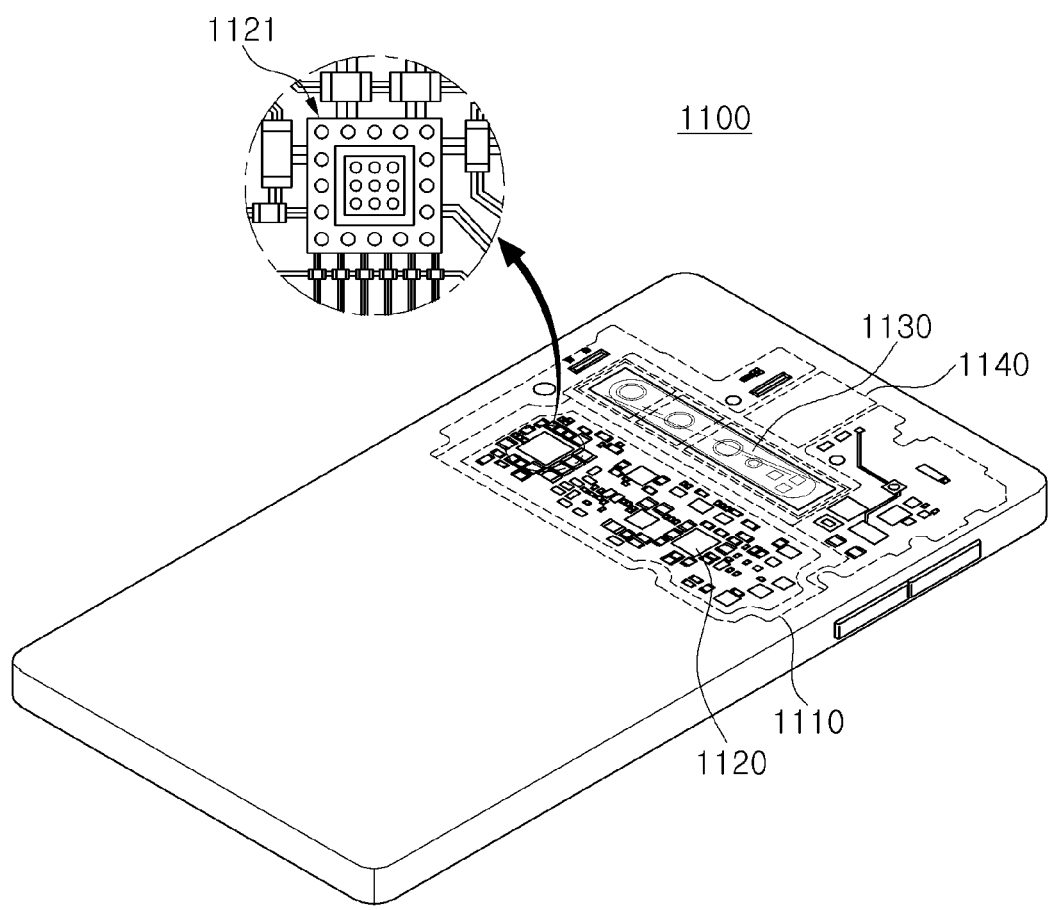
FIG. 2 is a perspective view schematically illustrating an example of an electronic device.

FIG. 2 is a schematic perspective view illustrating an example of an electronic device.

Referring to FIG. 2, the electronic device may be, for example, a smartphone 1100. A motherboard 1110 is accommodated inside the smartphone 1100, and various electronic components 1120 are physically and/or electrically connected to the motherboard 1110. In addition, a camera module 1130 and/or a speaker 1140 are accommodated inside of the electronic device. A portion of the electronic component 1120 may be the aforementioned chip-related component, for example, the printed circuit board 1121, but is not limited thereto. The printed circuit board 1121 may have a form in which an electronic component is embedded in the multilayer printed circuit board, but the configuration is not limited thereto. On the other hand, the electronic device is not necessarily limited to the smartphone 1100, and of course, maybe other electronic devices as described above.

Figure 3:
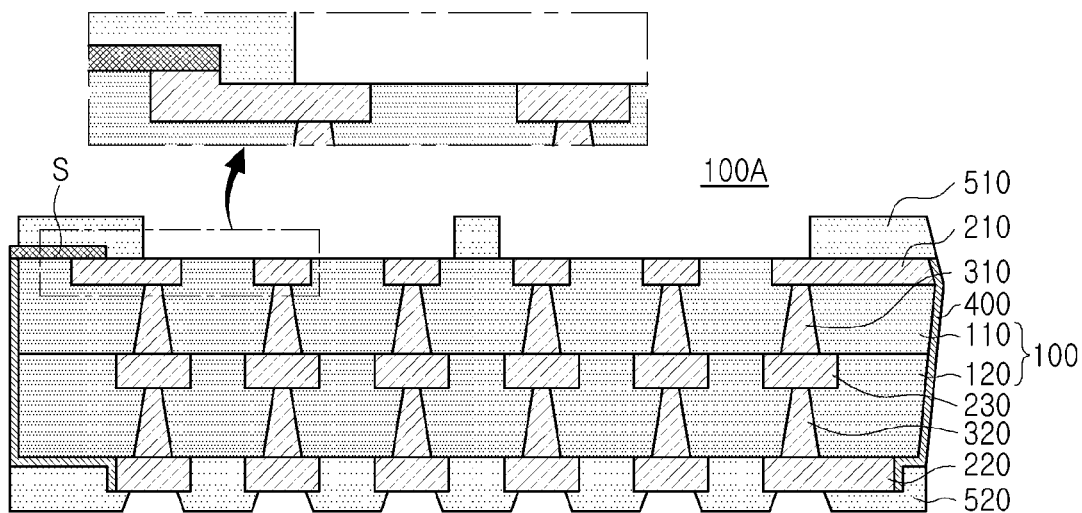
FIG. 3 is a cross-sectional view schematically illustrating an example of a printed circuit board.

FIG. 3 is a cross-sectional view schematically illustrating an example of a printed circuit board.

Referring to FIG. 3, a printed circuit board 100A according to an example includes an insulating body 100 including a plurality of insulating layers 110 and 120, first and second wiring layers 210 and 220 disposed on one surface and the other surface of the insulating body 100, respectively, and a shielding layer 400 covering a side surface of the insulating body 100 and electrically connected to the first and second wiring layers 210 and 220.

For example, the printed circuit board 100A according to an example maybe be manufactured by an Embedded Trace Substrate (ETS) method, as in a process to be described later. The insulating body 100 may have one surface and the other surface opposing each other, and in this case, the first wiring layer 210 may be disposed to be embedded in one surface of the insulating body 100. For example, the first wiring layer 210 may be embedded from one surface of the first insulating layer 110 of the insulating body 100.

On the other hand, by the ETS method to be described later, the second wiring layer 220 may be disposed on the other surface of the printed circuit board 100A according to an example. Unlike the first wiring layer 210 embedded from one surface of the insulating body 100, the second wiring layer 220 maybe disposed to protrude from the other surface opposing the one surface of the insulating body 100.

The printed circuit board 100A according to an example may further include a seed layer S disposed on one surface of the insulating body 100. The seed layer S may be disposed on one surface of the first insulating layer 110, may cover at least a portion of the first wiring layer 210 embedded in one surface of the first insulating layer 110, and may be electrically connected to the first wiring layer 210.

The printed circuit board 100A according to an example includes the shielding layer 400 covering the side surface of the insulating body 100. The shielding layer 400 covers all sides of each of the first and second insulating layers 110 and 120 of the insulating body 100, and may be extended to the other surface of the insulating body 100. Also, the shielding layer 400 maybe electrically connected to the first and second wiring layers 210 and 220. The shielding layer 400 may be connected while being in contact with the seed layer S that contacts and is connected to the first wiring layer 210 and may be in contact with and connected to the side surface of the second wiring layer 220. As the shielding layer 400 is respectively connected to the first and second wiring layers 210 and 220 disposed on one surface and the other surface of the insulating body 100, the printed circuit board 100A may be surrounded by the seed layer S, the shielding layer 400 and the first and second wiring layers 210 and 220, thereby obtaining complete shielding of electromagnetic interference (EMI).

A width of the printed circuit board 100A in one region between one surface and the other surface of the insulating body 100, according to an example, may be greater than a width thereof in each of the one surface and the other surface of the insulating body 100. For example, in a cross-sectional view in which the printed circuit board 100A is projected on a plane parallel to the stacking direction, the width of the printed circuit board 100A in the area in which the lower surface of the first wiring layer 210 and the first insulating layer 110 of the insulating body 100 are in contact with each other may be greater than the width of the printed circuit board 100A on each of one surface and the other surface of the insulating body 100. For example, at least a portion of each side surface of the insulating body 100, the first wiring layer 210, and the shielding layer 400 may not perfectly be parallel to the stacking direction of the printed circuit board 100A, and may have an inclination.

Hereinafter, the components of the printed circuit board 100A according to an example will be described in more detail with reference to the drawings.

The insulating body 100 may include a plurality of insulating layers 110 and 120, and the plurality of insulating layers may include first and second insulating layers 110 and 120.

An insulating material may be used as a material of the plurality of insulating layers 110 and 120 in the insulating body 100, and a thermosetting resin such as an epoxy resin or a thermoplastic resin such as polyimide may be used as the insulating material. In addition, a mixed material in which an inorganic filler such as silica and a reinforcing material such as glass fiber are included in these resins may also be used. For example, prepreg and Ajinomoto build-up film (ABF) may be used, but the material is not limited thereto. On the other hand, the ABF may be provided in the form of resin coated copper (RCC), but is not limited thereto. If necessary, a photoimageable material such as Photoimageable Dielectric (PIE) may be used.

Referring to FIG. 3, the insulating body 100 is comprised of two layers including the first and second insulating layers 110 and 120, but the insulating body 100 may also be formed of only a single insulating layer and may include a larger number of insulating layers.

A plurality of wiring layers 210, 220 and 230 may include first to third wiring layers 210, 220 and 230, and each of the first to third wiring layers 210, 220 and 230 may be disposed in at least one of the inside and the outside of the insulating body 100.

As described above, the first wiring layer 210 may be disposed in one surface of the insulating body 100, for example, embedded from one surface of the first insulating layer 110. Also, at least a portion of the first wiring layer 210 may be exposed from a side surface of the first insulating layer 110. On the other hand, the second wiring layer 220 may be disposed to protrude from the other surface of the insulating body 100, in detail, on the other surface of the second insulating layer 120.

A metal material may be used as a material of the plurality of wiring layers 210, 220 and 230, and as the metal material, copper (Cu), aluminum (Al), silver (Ag), tin (Sn), gold (Au), nickel (Ni), lead (Pb), titanium (Ti), or alloys thereof may be used. The plurality of wiring layers 210, 220, and 230 may perform various functions according to a design, and for example, may include a ground pattern, a power pattern, a signal pattern, and the like. Each of these patterns may have a line, plane, or pad shape. Each of the plurality of wiring layers 210, 220, and 230 may be formed by a plating process such as an additive process (AP), semi-AP (SAP), modified SAP (MSAP), tenting (TT), or the like. The first wiring layer 210 may be formed on the seed layer S by performing electrolytic plating thereon, and the second and third wiring layers 220 and 230 are disposed by the above-described plating process, and as a result, may include a seed layer that is an electroless plating layer, and an electrolytic plating layer formed based on the seed layer. For example, when the plurality of insulating layers 110 and 120 in the insulating body 100 are provided in the form of RCC, the plurality of wiring layers 210, 220 and 230 may further include a metal foil such as copper foil, and, if necessary, a primer resin may be present on the surface of the metal foil.

On the other hand, in the case of FIG. 3, the three-layer structure of the first to third wiring layers 210, 220, and 230 is illustrated, but by designing to correspond to the configuration of the insulating body 100, the plurality of wiring layers may have fewer or more layers.

A plurality of via layers 310 and 320 include a first via layer 310 penetrating through the first insulating layer 110 and electrically connecting the first and third wiring layers 210 and 230, and a second via layer 320 penetrating through the second insulating layer 120 and electrically connecting the second and third wiring layers 220 and 230. Respective via layers 310 and 320 include a plurality of vias that are filled with conductors in a plurality of via holes.

A metal material may be used as a material of the plurality of via layers 310 and 320, and as the metal material, copper (Cu), aluminum (Al), silver (Ag), tin (Sn), gold (Au), nickel (Ni), lead (Pb), titanium (Ti), or alloys thereof may be used. The plurality of via layers 310 and 320 may include signal vias, ground vias, power vias, and the like according to a design. In each of the vias of the plurality of via layers 310 and 320, the via hole may be completely filled with a metal material, or the metal material may be formed along the wall surface of the via hole. The plurality of via layers 310 and 320 may also be formed by a plating process, for example, AP, SAP, MSAP, TT, or the like, and may include a seed layer that is an electroless plating layer, and an electrolytic plating layer that is formed based on the seed layer. Vias of each of the first and second via layers 310 and 320 may have a tapered shape of which a width of one surface is smaller than a width of the other surface.

In FIG. 3, the plurality of via layers is illustrated as having two layers of the first and second via layers 310 and 320, but according to the configuration of the insulating body 100 and the design of the wiring layer, the via layer may also be formed of a single layer or may have more layers.

The seed layer S may be disposed on one surface of the insulating body 100 to cover at least a portion of the first wiring layer 210. In detail, referring to FIG. 3, the seed layer S may be connected to at least a portion of the upper surface of the first wiring layer 210, and may be disposed to be exposed from the side surface of the insulating body 100. In this case, the seed layer S maybe disposed to protrude from the side surface of the first insulating layer 110 as illustrated in FIG. 3. As such, a thickness of a portion of the seed layer S, which is not disposed on (or does not overlap with) the first wiring layer 210, may have a thickness less than a thickness of a combined portion of the seed layer S and the first wiring layer 210 that overlap with each other in a stacking direction of the insulating layers 110 and 120, and a thickness of a portion of the first wiring layer 210, which does not overlap with the seed layer S in the stacking direction and from which a via 310 extends, may have a thickness less than the thickness of the combined portion of the seed layer S and the first wiring layer 210. Although not illustrated, the seed layer S may be exposed from the side surface of the first insulating layer 110 in a state in which the seed layer S is embedded in the side surface of the first insulating layer 110. The seed layer S may be an electroless plating layer formed by electroless plating as in a manufacturing process to be described later, and the seed layer S may have a thickness less than a thickness of the first wiring layer 210 that is an electroplating layer.

As the seed layer S formed through electroless plating remains on one surface of the insulating body 100, not only the side surface of the printed circuit board 100A but also one surface of the printed circuit board 100A may be effectively shielded from EMI. In addition, in FIG. 3, the seed layer S is illustrated as being disposed only in a region adjacent to the side surface of the insulating body 100; however, the present embodiment is not limited thereto, and the seed layer S may also remain in a first opening of a first passivation layer 510 to which the first wiring layer 210 is exposed, on one surface of the insulating body 100. For example, the seed layer S may be disposed in the first opening of the first passivation layer 510, and the seed layer S may also have an opening exposing the first wiring layer 210. Accordingly, the first wiring layer 210 may be electrically connected to other components such as an electronic component 600 to be described later, and at the same time, one surface of the insulating body 100 may be effectively shielded.

As the seed layer S covers a portion of one surface of the insulating body 100 and is connected to the first wiring layer 210 and the shielding layer 400 to be described later, the seed layer S may perform a function to shield electromagnetic interference (EMI).

In the case of the printed circuit board 100A according to an example, electromagnetic interference maybe shielded by using the seed layer S required for the arrangement of the first wiring layer 210, and thus, even without forming a separate shielding layer, an electromagnetic wave shielding function may be performed on one surface of the insulating body 100. Therefore, manufacturing costs of the printed circuit board 100A according to the present disclosure maybe reduced and the manufacturing process thereof may be simplified.

The shielding layer 400 may be disposed on the side surface of the insulating body 100 to cover the side surfaces of the plurality of insulating layers 110 and 120 in the insulating body 100. In addition, the shielding layer 400 may be contact-connected with the seed layer S disposed on one surface of the insulating body 100, and may also be contact-connected with the first wiring layer 210 exposed to the side surface of the insulating body 100. In addition, the shielding layer 400 maybe electrically connected to the second wiring layer 220 disposed on the other surface of the insulating body 100 to protrude, and in detail, the shielding layer 400 may be contact-connected with the side surface of the second wiring layer 220. The shielding layer 400 may be connected to the seed layer S and the first wiring layer 210, and may be connected to a ground pattern in the printed circuit board 100A.

The shielding layer 400 may also be formed through an electroless plating process. The shielding layer 400 may be thinner than the first and second wiring layers 210 and 220 including the electrolytic plating layer. As the shielding layer 400 is disposed on the side surface of the insulating body 100 by electroless plating, thereby effectively preventing defects such as peeling and separation, compared to the side metal layer using the sputtering method.

As described above, the shielding layer 400 may be in contact with the seed layer S as described above. In this case, the shielding layer 400 may be in contact with the lower surface of the seed layer S, or the shielding layer 400 may also be disposed to extend on the side surface of the seed layer S to be contacted with the side surface of the seed layer S. For example, when the seed layer S is disposed to protrude from the side surface of the first insulating layer 110, the shielding layer 400 may be in contact with the lower surface of the seed layer S, and when the seed layer S is exposed to the side surface of the first insulating layer 110 while being embedded in the side surface of the first insulating layer 110, the shielding layer 400 may be disposed to extend on the side surface of the seed layer S.

The first and second passivation layers 510 and 520 may protect internal components from external physical and chemical damage. The first and second passivation layers 510 and 520 may each have a plurality of first and second openings. Each of the plurality of first openings may expose at least a portion of the first wiring layer 210. Each of the plurality of second openings may expose at least a portion of the second wiring layer 220. An insulating material may be used as the material of the first and second passivation layers 510 and 520. In this case, as the insulating material, a thermosetting resin such as an epoxy resin, a thermoplastic resin such as polyimide, or a mixture of these resins with an inorganic filler, but not limited to, ABF may be used.

FIGS. 4 to 18 are cross-sectional views schematically illustrating an example of manufacturing the printed circuit board of FIG. 3.

Figure 4:
FIGS. 4 to 18 are cross-sectional views schematically illustrating an example of manufacturing the printed circuit board of FIG. 3.
Figure 5:
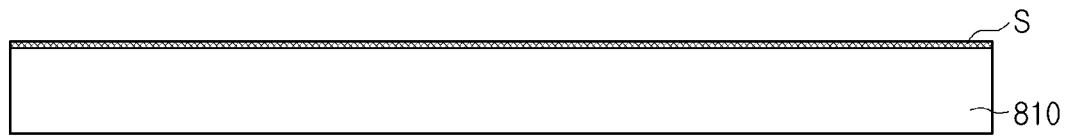
Figure 6:
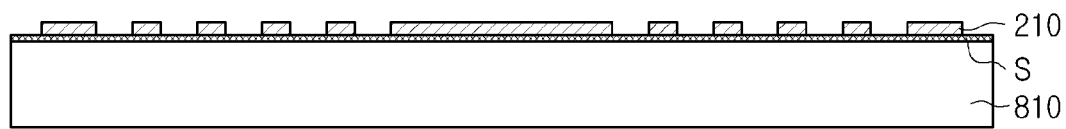

Referring to FIGS. 4 to 6, first, a first carrier 810 having a seed layer S that is disposed on at least one surface of the first carrier 810 is prepared. Thereafter, a first wiring layer 210 is formed on the seed layer S by plating and patterning processes.

Figure 7:
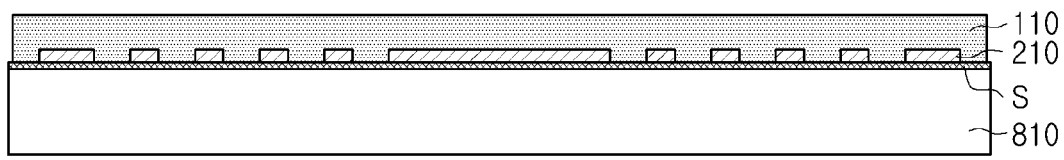
Figure 8:
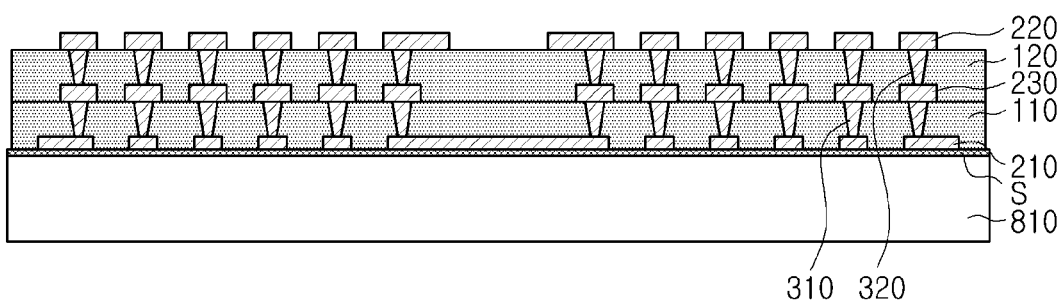

Next, referring to FIGS. 7 and 8, a first insulating layer 110 is formed on the first wiring layer 210 in such a manner that the first wiring layer 210 is embedded therein, a first via hole is formed to penetrate through the first insulating layer 110, a third wiring layer 230 is disposed on the first insulating layer 110, a first via layer 310 is formed to fill the inside of the first via hole, a second insulating layer 120 is formed on the first insulating layer 110 in such a manner that the third wiring layer 230 is embedded therein, a second via hole is formed to penetrate through the second insulating layer 120, a second wiring layer 220 is disposed on the second insulating layer 120, and a second via layer 320 is formed to fill the inside of the second via hole. Therefore, a precursor of the printed circuit board is formed. In this case, the first and second via holes and may be formed using a known via hole processing method such as a laser drilling method or a mechanical drilling method.

The insulating body 100 including the first and second insulating layers 110 and 120 may completely cover the upper portion of the seed layer S, or may also cover at least a portion of the upper portion of the seed layer S.

Figure 9:
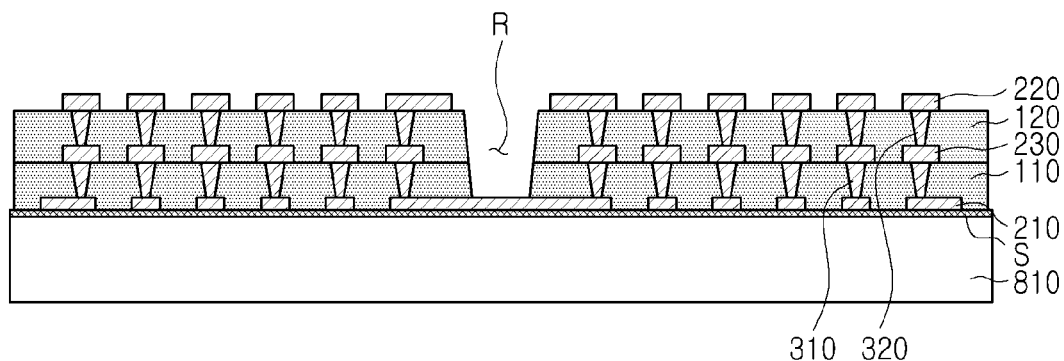

Referring to FIG. 9, a recess portion R is formed in the precursor of FIG. 8 by laser drilling or mechanical drilling. At least a portion of the first wiring layer 210 may be exposed to a lower portion of the recess portion R. For example, when the recess portion R is formed using laser drilling, the sidewall of the recess portion R is not parallel to the stacking direction of the precursor of the printed circuit board, but may have an inclined shape.

Figure 10:
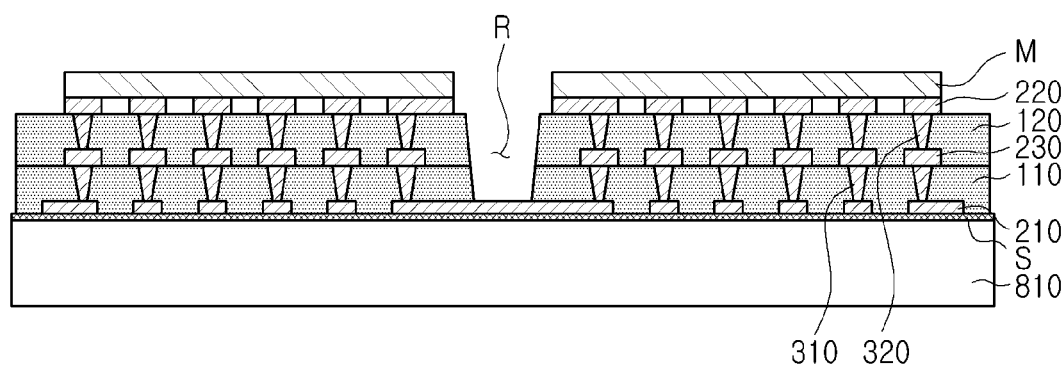

Referring to FIG. 10, to dispose the shielding layer 400, a mask M may be disposed in an area except for an area in which the shielding layer 400 is to be disposed. Thereafter, referring to FIG. 11, the shielding layer 400 may be disposed on the side and upper surfaces of the precursor of the printed circuit board of FIG. 10, except for the area in which the mask M is disposed, by the electroless plating process.

Figure 11:
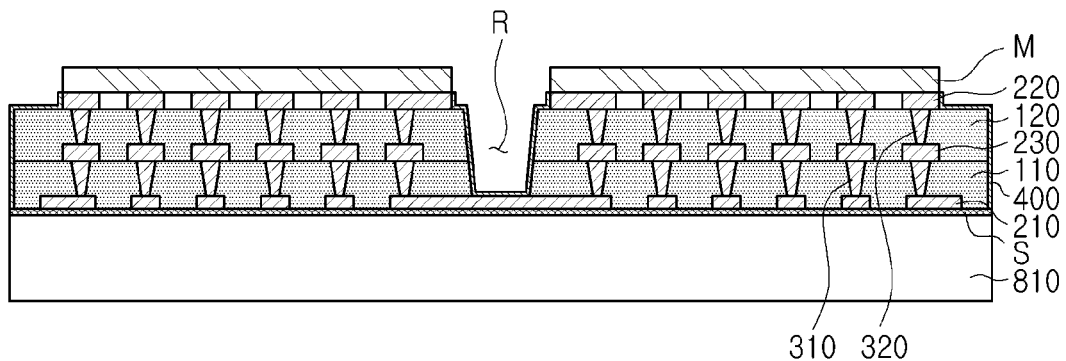

In the case of FIG. 11, the mask M is illustrated to cover the entirety of the upper surface of the second wiring layer 220, but as an example not illustrated, the mask M may expose a portion of the upper surface of the second wiring layer 220 if necessary, and in this case, the shielding layer 400 may be disposed to extend over the upper surface of the second wiring layer 220 as well as the side surface of the second wiring layer 220. In this case, in the final printed circuit board 100A of FIG. 3, the shielding layer 400 may be disposed to extend on the lower surface of the second wiring layer 220.

Figure 12:
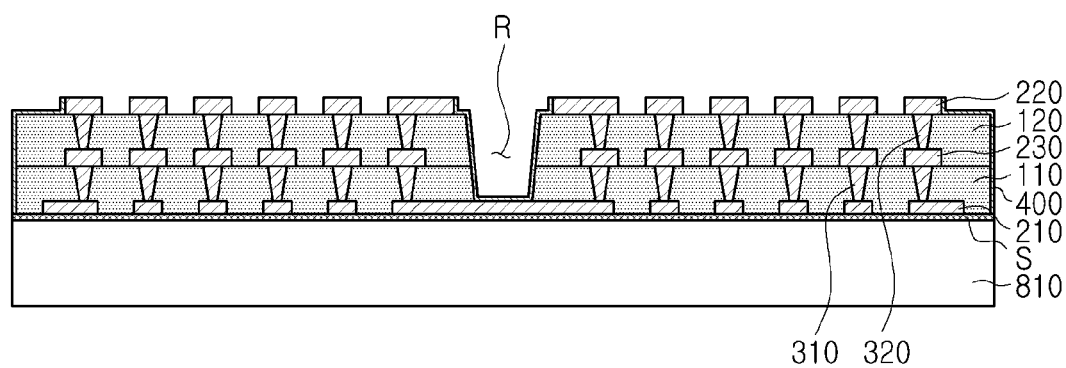

The shielding layer 400 may include an electroless plating layer, and may be disposed to contact the second wiring layer 220, the seed layer S, and the first wiring layer 210 exposed through the recess portion R. As illustrated in FIG. 12, after the shielding layer 400 is disposed, the mask M may be removed.

On the other hand, in the above-described process, in the case in which the insulating body 100 is manufactured to cover the upper portion of the seed layer S, the shielding layer 400 may be disposed to extend on the side surface of the seed layer S, and in the case in which the insulating body 100 is manufactured to expose at least a portion of the upper portion of the seed layer S, the shielding layer 400 may be disposed to contact the upper portion of the seed layer S.

Figure 13:
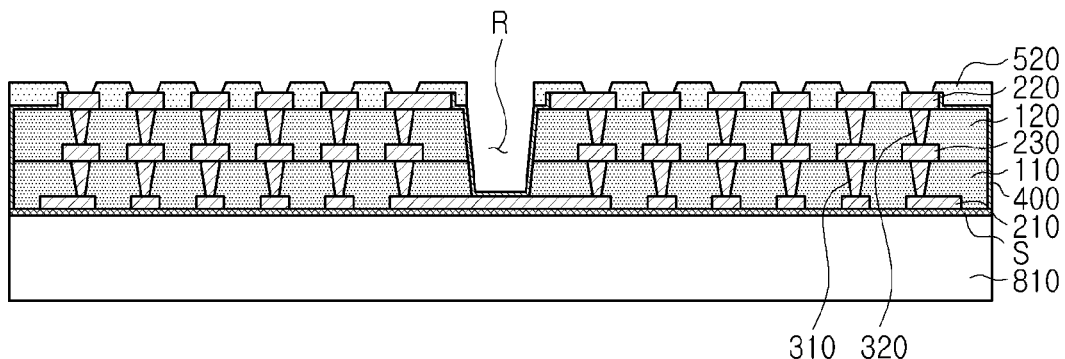

When the shielding layer 400 is disposed to be in contact with the upper portion of the seed layer S, the shielding layer 400 may contact and be connected to the lower surface of the seed layer S in the final printed circuit board 100A structure of FIG. 3, Referring to FIG. 13, a passivation layer 520 having a plurality of second openings exposing the second wiring layer 220 externally is disposed. The passivation layer 520 refers to the second passivation layer 520 in the completed printed circuit board 100A of FIG. 3.

Figure 14:
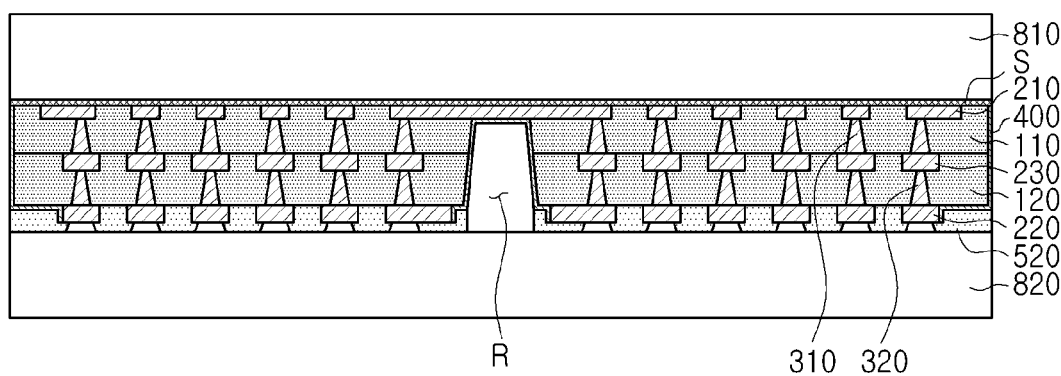
Figure 15:
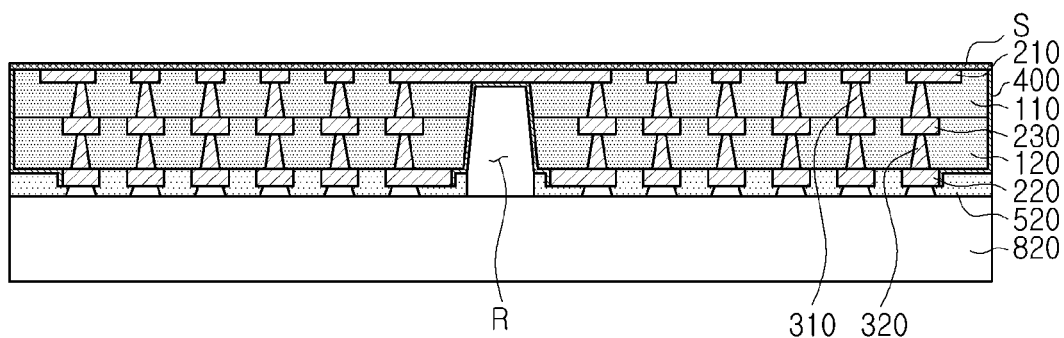

Referring to FIGS. 14 and 15, the precursor and the carrier of the printed circuit board of FIG. 13 are vertically inverted and disposed on a second carrier 820, and then the first carrier 810 is peeled off.

Figure 16:
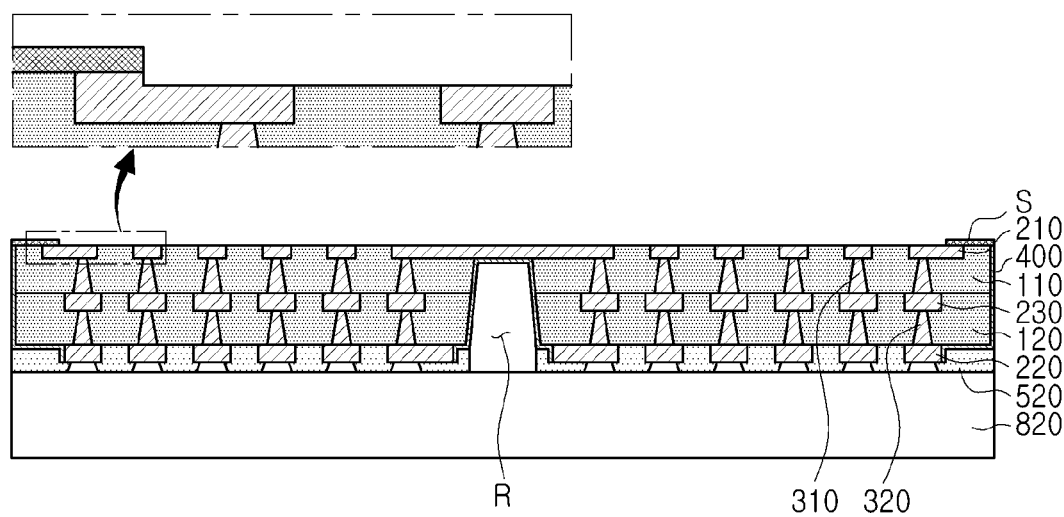

Referring to FIG. 16, a portion of the seed layer S may be removed. The removal of the seed layer S may be performed using a known method such as etching or blasting, and a mask or a resist may be used for partial removal of the seed layer S. As illustrated in FIG. 16, in the case of the seed layer S, only a region connecting the shielding layer 400 and the first wiring layer 210 may remain, and the remaining regions may be removed.

Figure 17:
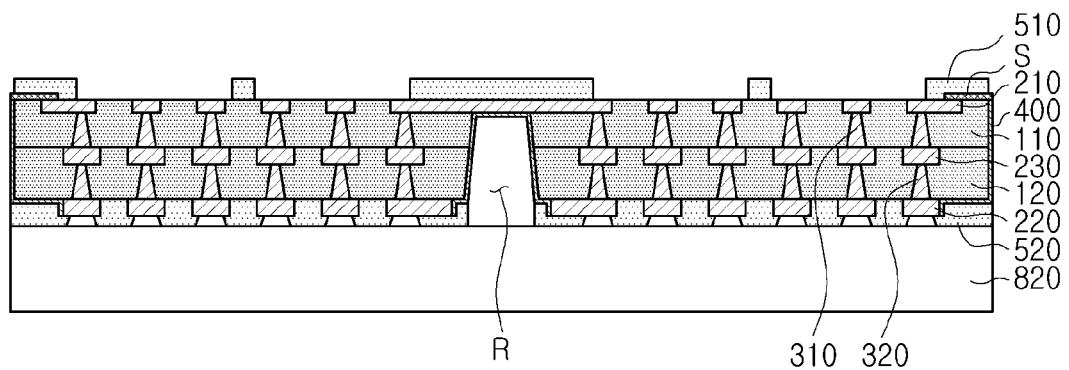

Referring to FIG. 17, a passivation layer 510 may be disposed on one surface of the insulating body 100 to cover the seed layer S and at least a portion of each of the first wiring layers 210 and to expose at least a portion of the first wiring layers 210 through a plurality of first openings. The passivation layer 510 is referred to as the first passivation layer 510 in the completed printed circuit board 100A of FIG. 3.

Figure 19:
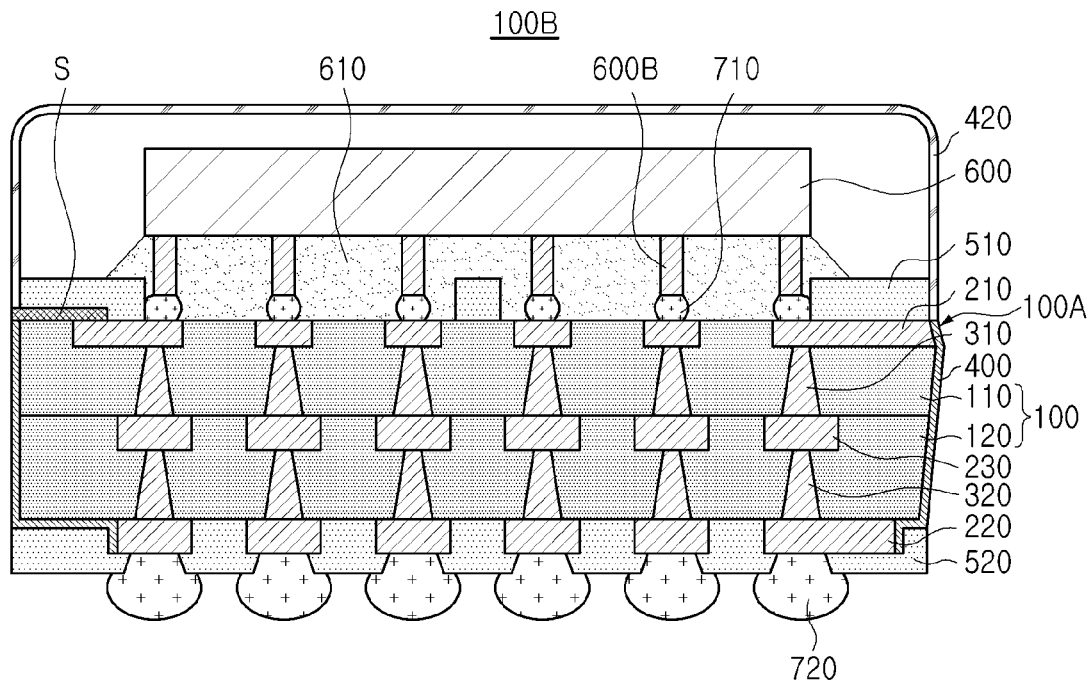
FIG. 19 is a cross-sectional view schematically illustrating an example of an electronic component package.
Figure 20:
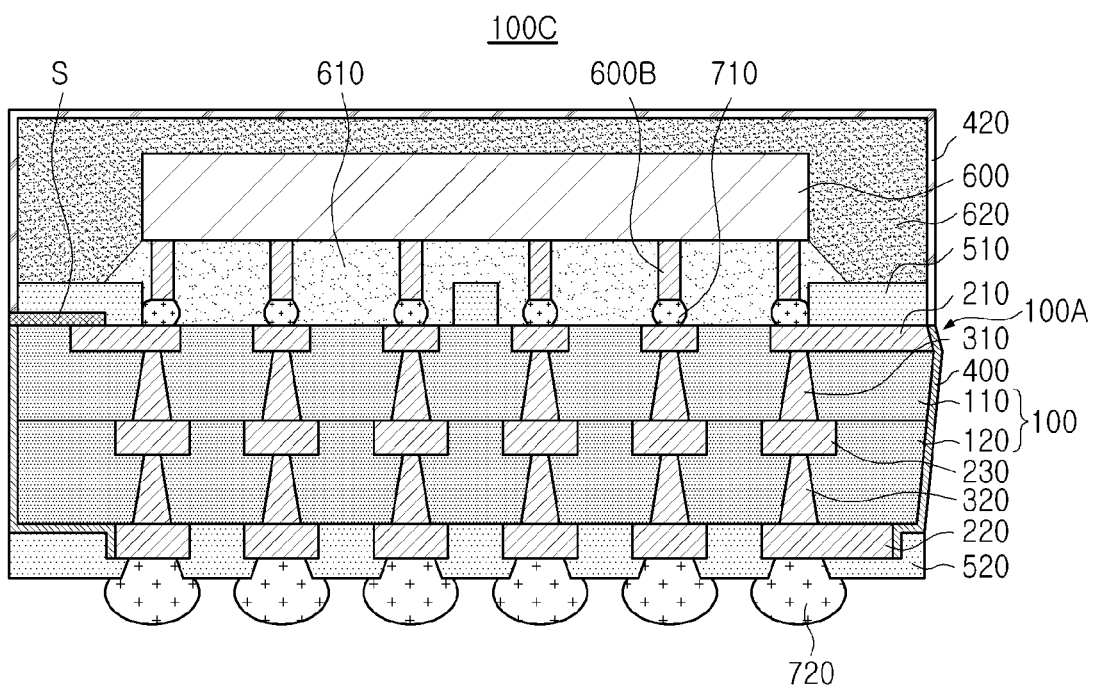
FIG. 20 is a cross-sectional view schematically illustrating another example of an electronic component package.

On the other hand, in FIG. 17, the first passivation layer 510 is illustrated to completely cover the seed layer S, but the first passivation layer 510 may expose at least a portion of the seed layer S according to necessity and design. A structure in which the first passivation layer 510 exposes the seed layer S is illustrated in FIGS. 19 and 20 to be described later.

Figure 18:
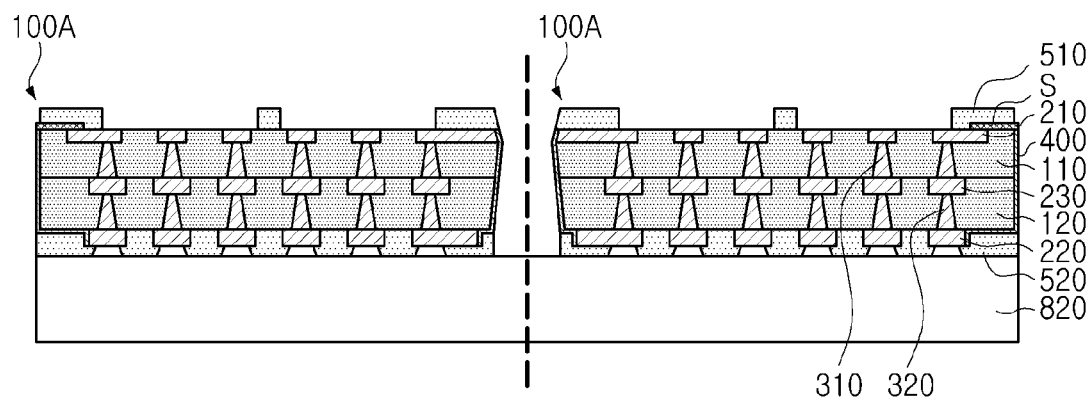

Referring to FIG. 18, the recess portion R is exposed to the precursor of FIG. 17 through laser drilling or mechanical drilling. For example, as a portion of the first wiring layer 210 exposed through the recess portion R is removed, the recess portion R completely penetrates through the insulating body 100, and the precursor of FIG. 17 may be divided into a plurality of printed circuit boards 100A. Thereafter, the second carrier 820 is separated.

In this case, the process of FIG. 18 may be a process of separating the substrate by cutting or singulation, and when using laser drilling, the sidewall of the printed circuit board 100A is not parallel to the stacking direction of the printed circuit board 100A and may have an inclined shape.

For example, as illustrated in FIG. 18, in the laser drilling process on both surfaces described above, the width of the printed circuit board 100A in one area between one surface and the other surface of the insulating body 100 may be greater than the width thereof on each of one surface and the other surface of the insulating body 100.

FIG. 19 is a cross-sectional view schematically illustrating an example of an electronic component package.

Referring to FIG. 19, an electronic component package 100B has a structure in which an electronic component 600 is mounted on one surface of the printed circuit board 100A and the shielding layer includes first and second shielding layers 400 and 420, compared with the printed circuit board 100A according to an example of the present disclosure. Therefore, in describing the structure of the electronic component package 100B, only a configuration added in comparison with the configuration of the printed circuit board 100A of the present disclosure will be described. For the remaining components of the electronic component package 100B, the description of the above-described printed circuit board 100A may be applied as it is.

Referring to FIG. 19, the electronic component 600 may be mounted on one surface of the insulating body 100 of the printed circuit board 100A.

The electronic component 600 may be an integrated circuit (IC) die in which hundreds to millions of devices are integrated in a single chip. For example, the electronic component 600 may be a processor chip such as a central processor (e.g., CPU), a graphics processor (e.g., GPU), a field programmable gate array (FPGA), a digital signal processor, an encryption processor, a microprocessor, a microcontroller, and the like, in detail, may be an application processor (AP), but is not limited thereto. In addition, the electronic component 600 may also be memories such as a volatile memory (e.g., DRAM), a non-volatile memory (e.g., ROM), a flash memory, or the like, or may be a logic such as an analog-to-digital converter or an application-specific IC (ASIC). If necessary, the electronic component 600 may be a chip-type passive component, for example, a chip-type inductor or a chip-type capacitor. The electronic component 600 may be disposed in such a manner that the surface on which a connection pad (not illustrated) or a bump 600B is disposed faces downwardly, and the opposite side thereof faces upwardly. The connection pad or the bump 600B of the electronic component 600 may include a metal material such as copper (Cu) or aluminum (Al), and may be electrically connected to a first electrical connection metal 710. The electronic component 600 may be attached on one surface of the printed circuit board 100A by an adhesive film 610 such as an underfill layer or the like, if necessary.

The plurality of first and second electrical connection metals 710 and 720 are disposed on a plurality of first and second openings of the first and second passivation layers 510 and 520, respectively. The plurality of first electrical connection metals 710 may electrically connect the exposed first wiring layers 210 to the bumps 600B of the electronic component 600 described above. The plurality of second electrical connection metals 720 may be electrically connected to the exposed second wiring layers 220, respectively. The plurality of first electrical connection metals 710 may physically and/or electrically connect the printed circuit board 100A to an external source. Therefore, for example, the printed circuit board 100A may be mounted on a mainboard of an electronic device or other BGA board. The plurality of first electrical connection metals 710 may physically and/or electrically connect the printed circuit board 100A to the electronic component 600 surface-mounted thereon. Each of the plurality of first and second electrical connection metals 710 and 720 may be formed of tin (Sn) or an alloy containing tin (Sn), for example, solder or the like, but the configuration is not limited thereto. The plurality of first and second electrical connection metals 710 and 720 may each be a land, a ball, a pin, or the like.

The adhesive film 610 may perform a function of stably fixing the electronic component 600 and the bump 600B on one surface of the printed circuit board 100A. The adhesive film 610 may be disposed on one surface of the printed circuit board 100A, to cover the side surfaces of the first electrical connection metal 710 and the bump 600B. An insulating material may be used as the material of the adhesive film 610. As the insulating material, a photoimageable dielectric material such as PID, a thermosetting resin such as an epoxy resin, a thermoplastic resin such as polyimide, or a mixture of these resins with an inorganic filler such as silica and/or a reinforcing material such as glass fiber, for example, prepreg, ABF, or the like maybe used. Alternatively, the adhesive film 610 may be formed of a Non-Conductive Paste (NCP) or a Non-Conductive Film (NCF).

On the other hand, in the case of the electronic component package 100B of FIG. 19, the first and second shielding layers 400 and 420 may perform a function of shielding electromagnetic wave interference. The shielding layer in the printed circuit board 100A described above corresponds to the first shielding layer 400 in the electronic component package 100B, and the printed circuit board 100A may be completely shielded due to the first shielding layer 400.

After the above-described electronic component 600 is mounted on one surface of the printed circuit board 100A, the second shielding layer 420 accommodating the electronic component 600 therein may be disposed on one surface of the printed circuit board 100A.

The second shielding layer 420 may be a shield can, and may be in contact with and connected to the seed layer S and the first wiring layer 210, thereby effectively shielding the electronic component 600 mounted on the printed circuit board 100A. For example, the electronic component package 100B according to the present disclosure may completely shield electromagnetic interference through the first and second shielding layers 400 and 420.

The second shielding layer 420 may include a metal material to easily block electromagnetic waves. However, the material of the second shielding layer 420 is not limited to metal. For example, the second shielding layer 420 may also be formed of a synthetic resin material including metal powder.

As described above, the first passivation layer 510 may expose at least a portion of each of the seed layer S and the first wiring layer 210. The second shielding layer 420 is in contact with and connected to the seed layer S and the first wiring layer 210 exposed from the first passivation layer 510, thereby protecting the electronic component 600 and the electronic component package 100B.

For other overlapping configurations, the above-described descriptions may be equally applied thereto, and detailed descriptions thereof will be omitted.

FIG. 20 is a cross-sectional view schematically illustrating another example of an electronic component package.

Referring to FIG. 20, an electronic component package 100C according to another example has a structure in which a mold portion 620 is disposed to cover the electronic component 600 and the second shielding layer 420 covers the mold portion 620, as compared with the electronic component package 100B according to an example of the present disclosure. Therefore, in describing the structure of the electronic component package 100C according to another example, only a configuration different from the configuration of the electronic component package 100B according to the example will be described. The description of the electronic component package 100B according to the above-described example may be applied to the remaining components of the electronic component package 100C as it is.

Referring to FIG. 20, after the electronic component 600 is mounted on the printed circuit board 100A, the mold portion 620 maybe disposed on one surface of the printed circuit board 100A to cover the electronic component 600. The mold portion 620 may seal the electronic component 600 to fix the electronic component 600 on the printed circuit board 100A, and may protect the electronic component 600 from external impact and physical/chemical damage. On the other hand, the mold portion 620 may not cover the seed layer S and the first wiring layer 210 exposed from the first passivation layer 510.

The mold portion 620 may be formed of an insulating material including a resin material such as epoxy, for example, formed of an Epoxy Molding Compound (EMC).

In the case of the electronic component package 100C according to another example, the second shielding layer 420 may be disposed on the outer surface of the mold portion 620 and may be extended on the seed layer S and the first wiring layer 210. As the second shielding layer 420 is in contact with and connected to the seed layer S and the first wiring layer 210, the electronic component 600 disposed in the mold portion 620 may be effectively shielded from electromagnetic interference.

For other overlapping configurations, the above descriptions maybe equally applied, and detailed descriptions thereof will be omitted.

As set forth above, a printed circuit board and an electronic component package having an Embedded Trace Substrate (ETS) structure and advantageous for electromagnetic wave shielding may be provided.

In addition, a printed circuit board and an electronic component package having a shielding layer covering the side surface of the printed circuit board to be advantageous for electromagnetic wave shielding may be provided.

While this disclosure includes specific examples, it will be apparent to one of ordinary skill in the art that various changes in form and details maybe made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   an insulating body having one surface and another surface opposing each other;
   first and second wiring layers disposed on the one surface and the another surface of the insulating body, respectively;
   a seed layer disposed on the one surface of the insulating body and covering at least a portion of the first wiring layer;
   a shielding layer covering a side surface of the insulating body and connected to the first and second wiring layers; and
   a first passivation layer disposed on the another surface of the insulating body,
   wherein the shielding layer extends to the another surface of the insulating body and is disposed between the insulating body and the first passivation layer.

2. The printed circuit board of claim 1, wherein the first wiring layer is embedded from the one surface of the insulating body, and
   the second wiring layer protrudes from the another surface of the insulating body.

3. The printed circuit board of claim 2, wherein the seed layer protrudes from the one surface of the insulating body, and
   an upper surface of the seed layer and an upper surface of the first wiring layer have a step difference.

4. The printed circuit board of claim 1, wherein one end of the shielding layer is in contact with and connected to the seed layer.

5. The printed circuit board of claim 1, wherein at least a portion of one end of the shielding layer is in contact with and connected to a lower surface of the seed layer or a side surface of the seed layer.

6. The printed circuit board of claim 1, wherein at least a portion of one end of the shielding layer extends onto a side surface of the first wiring layer.

7. The printed circuit board of claim 1, wherein the shielding layer extends on the another surface of the insulating body, and an end of the shielding layer is in contact with and connected to a side surface of the second wiring layer.

8. The printed circuit board of claim 1, wherein the seed layer and the shielding layer are electroless plating layers.

9. The printed circuit board of claim 1, wherein the seed layer has a thickness less than a thickness of the first wiring layer.

10. The printed circuit board of claim 1, wherein the shielding layer extends on a lower surface of the second wiring layer.

11. The printed circuit board of claim 1, wherein the first passivation layer has a first opening exposing at least a portion of the second wiring layer,
 the printed circuit board further comprises a second passivation layer disposed on the one surface of the insulating body and having a second opening exposing at least a portion of the first wiring layer; and
 wherein the second passivation layer covers at least a portion of each of an upper surface and a side surface of the seed layer.

12. The printed circuit board of claim 1, wherein the insulating body includes a plurality of insulating layers, and the printed circuit board further comprises:
 a wiring layer disposed inside of the insulating body,
 a plurality of via layers respectively penetrating through the plurality of insulating layers, and connected to the first and second wiring layers.

13. The printed circuit board of claim 1, wherein a width of the printed circuit board in one area between one surface and the another surface of the insulating body is greater than a width of the printed circuit board at each of the one surface and the another surface of the insulating body.

14. An electronic component package comprising:
 a printed circuit board including an insulating body having one surface and another surface opposing each other, a first wiring layer disposed on the one surface of the insulating body, a seed layer disposed on the one surface of the insulating body and covering at least a portion of the first wiring layer, and a first shielding layer covering a side surface of the insulating body;
 an electronic component disposed on the one surface of the insulating body; and
 a second shielding layer disposed on the one surface of the insulating body, connected to the first shielding layer, and enclosing the electronic component.

15. The electronic component package of claim 14, further comprising a second wiring layer disposed on the another surface of the insulating body,
 wherein the seed layer protrudes from the one surface of the insulating body,
 the first wiring layer is embedded from the one surface of the insulating body, and
 the first shielding layer is in contact with and connected to each of the seed layer and the second wiring layer.

16. The electronic component package of claim 14, further comprising a mold portion covering the electronic component,
 wherein the second shielding layer is disposed on an external surface of the mold portion and is in contact with and connected to each of the first wiring layer and the seed layer.

17. A printed circuit board comprising:
 an insulating body;
 a conductive layer disposed on one surface of the insulating body and including a pattern extending from an edge of the insulating body;
 a via disposed in the insulating body and connected to the pattern; and
 a shielding layer covering a first side surface of the insulating body and connected to the pattern,
 wherein the pattern includes a first portion having a first thickness, a second portion having a second thickness, and a third portion having a third thickness sequentially disposed from the edge of the insulating body towards the via, and
 each of the first thickness and the third thickness is less than the second thickness.

18. The printed circuit board of claim 17, wherein the first thickness is less than the third thickness.

19. The printed circuit board of claim 17, wherein the shielding layer covers a second side surface of the insulating body opposite to the first side surface, and is connected to another pattern of the conductive layer.

20. The printed circuit board of claim 19, wherein a thickness of the another pattern is less than the thickness of the second portion.

21. The printed circuit board of claim 19, wherein the second side surface includes a portion having an inclined angle different from an inclined angle of the first side surface with respect to the one surface of the insulating layer.

22. The printed circuit board of claim 21, wherein the second side surface includes another portion having an inclined angle different from the inclined angle of the portion of the second side surface with respect to the one surface of the insulating layer.

23. The printed circuit board of claim 17, further comprising another conductive layer disposed on another surface of the insulating body,
 wherein the shielding layer extends on the another surface of the insulating body to connect to the another conductive layer.

24. The printed circuit board of claim 23, wherein the third portion is embedded in the insulating body, and the another conductive layer protrudes from the insulating body.

* * * * *